United States Patent [19]

Mullarkey

[11] 4,044,205

[45] Aug. 23, 1977

[54] RECEPTION TECHNIQUES FOR IMPROVING INTELLIGIBILITY OF AN AUDIO FREQUENCY SIGNAL

[75] Inventor: William Joseph Mullarkey, Whitefield, England

[73] Assignee: The Cunard Steam-Ship Company Limited, London, England

[21] Appl. No.: 557,240

[22] Filed: Mar. 11, 1975

Related U.S. Application Data

[63] Continuation-in-part of Ser. No. 510,704, Sept. 30, 1974, abandoned, which is a continuation of Ser. No. 319,685, Dec. 29, 1972, abandoned.

[30] Foreign Application Priority Data

Jan. 3, 1972  United Kingdom ............... 49/72

[51] Int. Cl.² .............................................. H03G 1/00
[52] U.S. Cl. ..................................... 179/1 P; 325/65
[58] Field of Search ............... 179/1 P, 1 VL, 1 D, 179/1 VC; 325/46, 47, 65, 62, 473, 474; 333/14, 18; 330/14, 29

[56] References Cited

U.S. PATENT DOCUMENTS

| | | | |
|---|---|---|---|
| 1,550,660 | 8/1925 | Affel | 325/65 |
| 2,358,045 | 9/1944 | Barney | 333/14 |
| 2,410,489 | 11/1956 | Fitch | 325/46 |
| 3,126,449 | 3/1964 | Shirman | 179/1 P |
| 3,140,446 | 7/1964 | Myers | 325/47 |
| 3,180,936 | 4/1965 | Schroeder | 179/1 P |
| 3,206,556 | 9/1965 | Bachman | 333/14 |
| 3,350,650 | 10/1967 | Kemper | 179/1 P X |
| 3,613,012 | 10/1971 | Ferstal | 325/47 |
| 3,803,357 | 4/1974 | Sacks | 179/1 P |
| 3,848,092 | 11/1974 | Shamma | 179/1 VL |

Primary Examiner—Kathleen H. Claffy
Assistant Examiner—E. S. Kemeny
Attorney, Agent, or Firm—Toren, McGeady and Stanger

[57] ABSTRACT

The reception technique for improving intelligibility of an audio frequency signal containing interference and wanted speech signals by selecting a narrow section of the frequency band of the audio frequency signal in which the interference is the least, and filtering out this section from the rest of the band. A control signal is then derived by utilizing the changing value of the mean amplitude of the filtered section, to amplitude modulate the interference, thereby eliminating noise between speech syllables. One embodiment involves deriving a control voltage proportional to the True-Signal Voltage, such that compressor-gain increases when there is only noise-signal at the input, (i.e., Zero True-Signal and thus Zero Control Voltage), which in turn over-drives a limiter to clip the input noise - signal.

25 Claims, 9 Drawing Figures

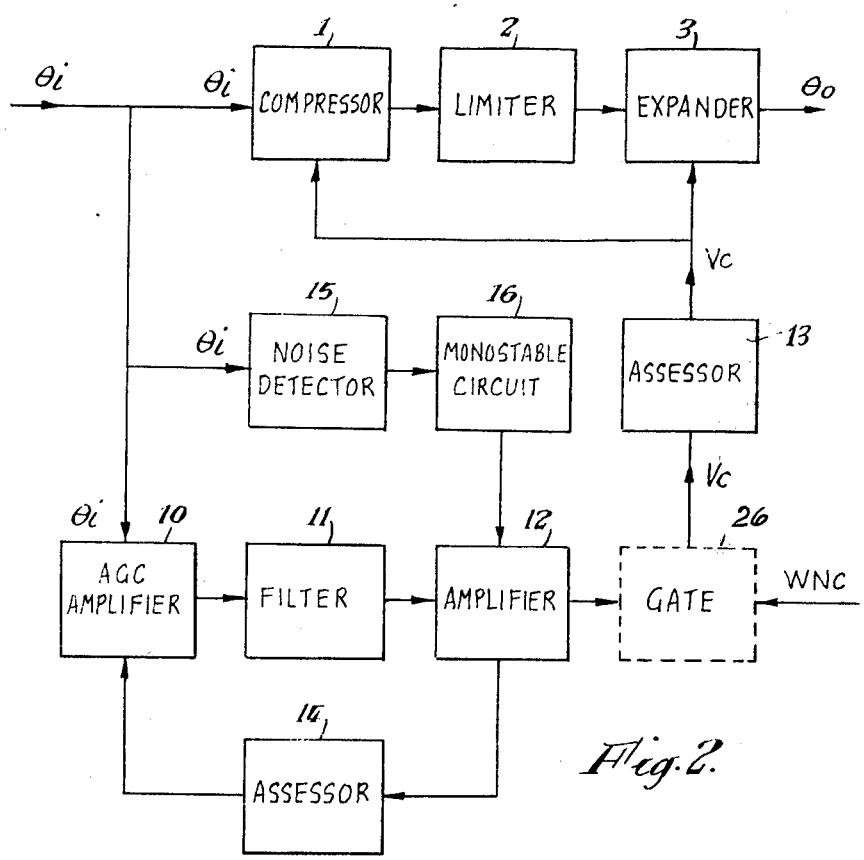
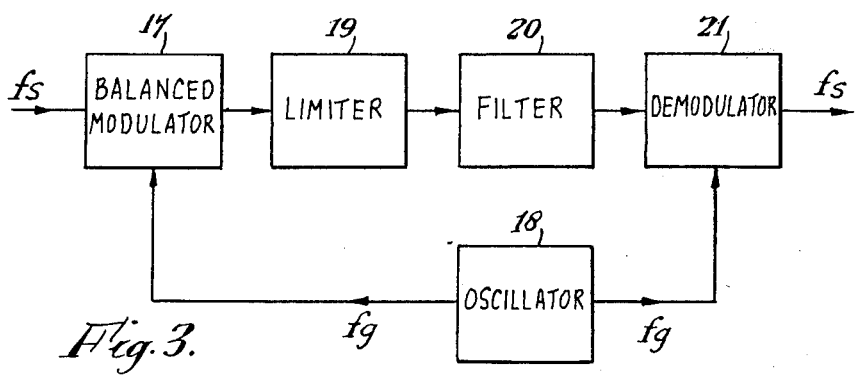

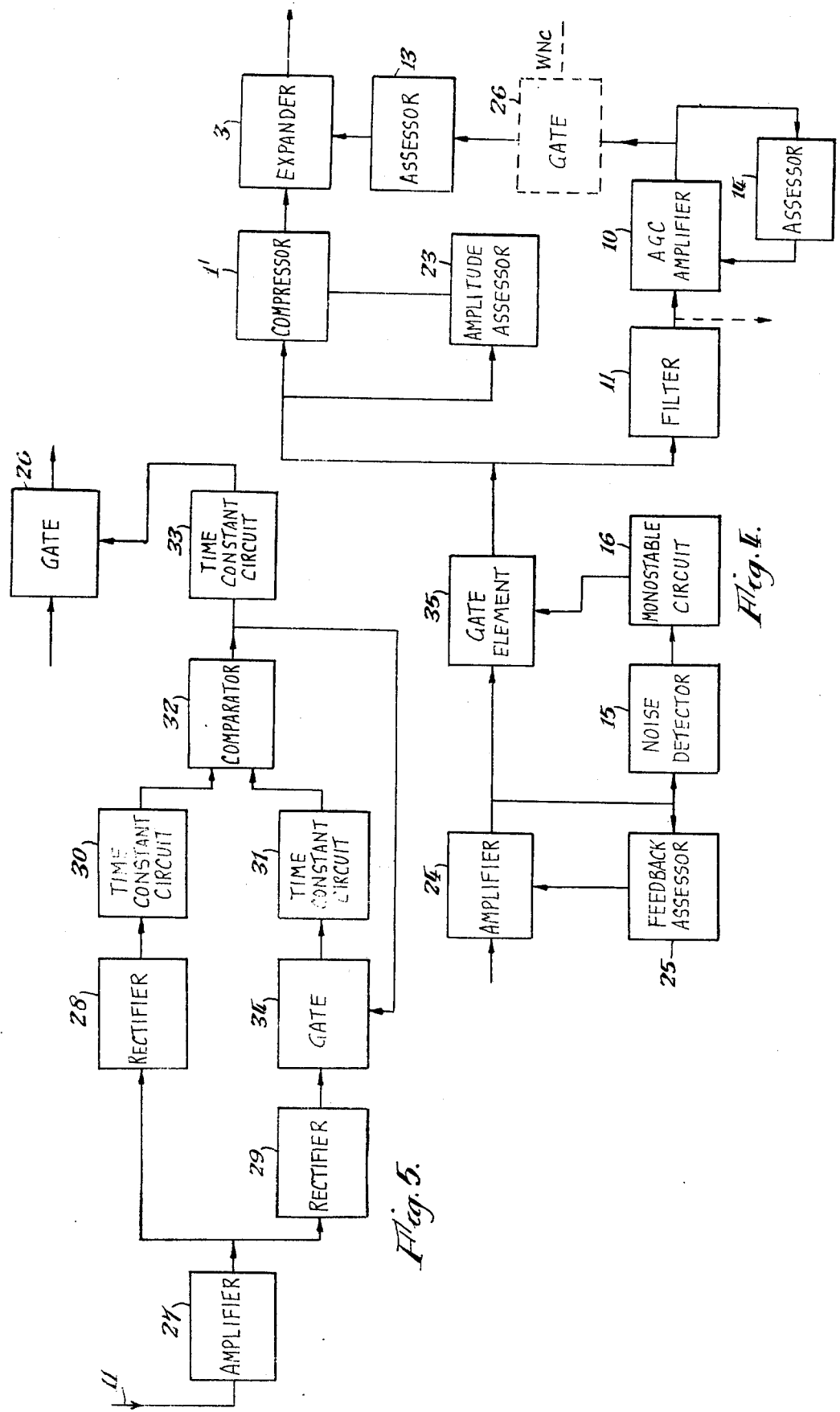

RECEPTION TECHNIQUES FOR IMPROVING INTELLIGIBILITY OF AN AUDIO FREQUENCY SIGNAL

RELATED APPLICATIONS

This application is a continuation-in-part of application Ser. No. 510,704, filed Sept. 30, 1974, now abandoned, which is itself a continuation of application Ser. No. 319,685 filed Dec. 29, 1972, now abandoned.

FIELD OF THE INVENTION

The present invention relates to reception techniques for improving intelligibility, more specifically to techniques for receiving telephone transmissions in the audio frequency range. Particularly in marine applications, interference can render a wanted speech signal unintelligible, and since it is not possible to remove the interference, after it has occurred the present invention so modulates the interference that intelligibility, as subjectively assessed, is improved to acceptable standards.

In any practical communication system which relies on the transmission of a signal, either through the atmosphere or along a line, the transmission channel contributes a certain amount of noise. Such noise has various relationships to the nature of the transmission channel, one such is that it is generally proportional to the bandwidth. Many systems have been devised for the reduction of noise for transmissions over long distances.

DESCRIPTION OF THE PRIOR ART

Previous attempts to improve the quality of radio transmission circuits have included firstly, increasing the transmitter power, in an attempt to raise the ratio of signal to interference, or secondly, increasing the circuit efficiency as a whole within the limits of the information theory by the use of special modulation techniques. The use of such special techniques often requires exactly compatible equipment at transmitter and receiver, and in some cases the increased channel efficiency is gained at the expense of making the circuit even more vulnerable to interference in practical conditions.

One such known system is disclosed in U.S. Pat. No. 2,410,489, which uses a technique of emphasizing the high audio frequencies at the transmitter, and complementary de-emphasizing said frequencies at the receiver to effectively reduce the noise bandwidth of the channel.

Speech processing systems fall into two broad categories, as follows:

a. Unilateral, i.e. techniques applied at one end only of the transmisson link, and b. Bilateral, i.e. techniques which require compatible equipment at each end of the link.

A whole group of bilateral systems depend upon compounding in one form or another; where the dynamic range of the signal is compressed (reduced) at the transmitter and expanded (increased) by a corresponding amount at the receiver.

One version of this is disclosed in U.S. Pat. No. 2,358,045. In this system the input signal is passed through two signal compressors in series, the first compressor dealing with the upper half of the band, and having a variable gain stage controlled by its own output to provide high gain for a low amplitude input signal and vice versa. The second stage similarly processes the lower half of the band. At the receiving end the signal is once again expanded to its original form by an inverse process. The system is thus designed to transmit a signal which is always at a reasonable amplitude with respect to noise.

SUMMARY OF THE INVENTION

It is an object of the present invention to introduce a new technique into ratio reception systems in which, at the receiving end only, the intelligibility of the audio frequency signal is improved by the reduction of noise between speech syllables.

According to one aspect of the present invention there is provided a method of improving intelligibility of an audio frequency signal containing interference and wanted speech signals, including the steps of selecting a narrow section of the frequency band of the audio frequency signal in which the interference is the least, filtering said narrow section from the remainder of the band, and deriving a control signal, by using the changing value of the mean amplitude of the filtered narrow section, to amplitude modulate the interference.

Preferably, the above method includes the step of amplifying the audio frequency signal by a gain which decreases as the value of the derived control signal increases, limiting the level of the interference to the compressed level of the speech signals, and amplifying the resulting limited signal by a gain which increases as the value of the derived control signal increases.

Preferably, the above method includes the additional step of detecting impulse noise, and muting the generation of the control signal for the duration of each pulse of said impulse noise.

Preferably, the step of limiting the level of the interference includes the step of modulating the filtered and amplified audio signal with a fixed frequency to produce a double side-band suppressed carrier signal, limiting the thus generated signal if its level exceeds that of the already compressed speech and demodulating the double side-band signal by heterodyning it with the fixed frequency, so as to recover the original audio signal in compressed and limited form.

According to another aspect of the present invention there is provided apparatus for improving intelligibility of an audio frequency signal containing interference and wanted speech signals in which a narrow section of the frequency band of the signal in which interference is the least is selected, said apparatus comprising a first filter for filtering out said narrow section from the remainder of the band; means for deriving a control signal whose value at any instant equals a control signal whose value at any instant equals the amplitude of the filtered narrow section; a compressor comprising an amplifier whose gain decreases either as the value of the derived control signal increases, or as the level of its input increases, in order to compress the speech signals to a fixed level, and an expander comprising an amplifier whose gain increases as the value of the derived control signal increases to thereby improve the intelligibility of the wanted speech signal, said compressor being connected to said expander, said control signal being supplied either to said compressor and expander, or to said expander alone, said apparatus amplitude modulating the interference to follow the amplitude modulation of the original speech, the expander producing an output which is the processed audio frequency speech signal.

BRIEF DESCRIPTION OF THE DRAWINGS

The present invention will now be described in greater detail, by way of example, with reference to the accompanying drawings, in which:

FIG. 1A is a block diagram illustrating the basic principle of one preferred form of system for improving intelligibility to an audio frequency signal;

FIG. 1B is a block diagram illustrating the basic principle of a second preferred form of system for improving intelligibility to an audio frequency signal;

FIG. 2 is a block diagram of the first preferred form of system based upon FIG. 1A;

FIG. 3 is a block diagram of the limiting circuit of FIG. 1A, which causes no harmonic distortion;

FIG. 4 is a block diagram of the second preferred form of system, based upon FIG. 1B;

FIG. 5 is a block diagram of a system for subjectively removing "white" noise which can be incorporated in the embodiments shown in FIGS. 2 and 4.

DESCRIPTION OF THE PREFERRED EMBODIMENTS

Figure 6:
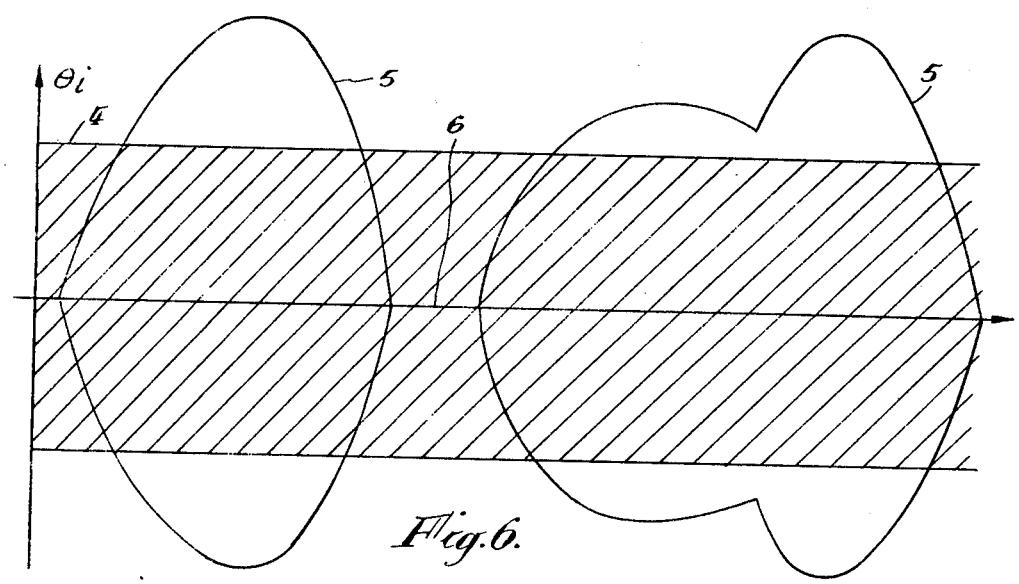
FIGS. 6, 7, 8 and 9 are waveforms showing signal amplitude plotted to a base of time illustrating the changes occurring to an input to the system of FIG. 1A, consisting of a wanted speech signal and an interference signal (shaded) as it passes through the system.

Referring to FIG. 1A, an input signal $\theta_i$ from an output of a radio receiver (not shown) and a control signal input $V_c$ enter a compressor 1. The control signal input $V_c$ is a D.C. voltage whose value varies directly with the level of the wanted speech — i.e. at a syllabic rate — and is derived in a manner to be described later. The input signal $\theta_i$ consists of any interference present at the output of the receiver (not shown) and the wanted speech signal, which is a combination of alternating voltages of several hundred different frequencies, which for radio transmission purposes normally lie within the range of 300 - 3000 Hz. These voltages are at different and constantly changing levels, as illustrated in FIG. 6, but a general peak level on quiet syllables can be specified, for example as $v_q$ volts. For this signal level, an equal D.C. voltage value $v_q$ of the control signal input voltage $V_c$ determines the gain of the compressor 1, which is an amplifier that amplifies the input signal $\theta_i$ by a gain that decreases as the value of $\theta_i$ increases; or, more specifically, for signal levels above the quiet syllable level $v_q$, the gain decreases as $V_c$ increases.

The output signal from the compressor 1 enters a limiter 2, which ideally contributes no distortion. Its operation is to give a linear change in output for a linear change in input, until the input exceeds a predetermined threshold value. Any increase in input above the threshold value produces no increase in output.

The output signal from the limiter 2 enters an expander 3, whose operation is also governed by the control signal input $V_c$. The expander 3 is an amplifier having an output $\theta_o$ which depends on a gain that increases as the value of $\theta_i$ increases; or, more specifically, for signal levels above the quiet syllable level $v_q$, the gain increases as $V_c$ increases. The output $\theta_o$ from the expander 3 is the output of the system.

The compressor 1 and the expander 3 are both standard circuits, and may, for example, be of the type disclosed in FIG. 6 of U.S. Pat. No. 2,358,045, or British Pat. No. 722,371.

Figure 7:
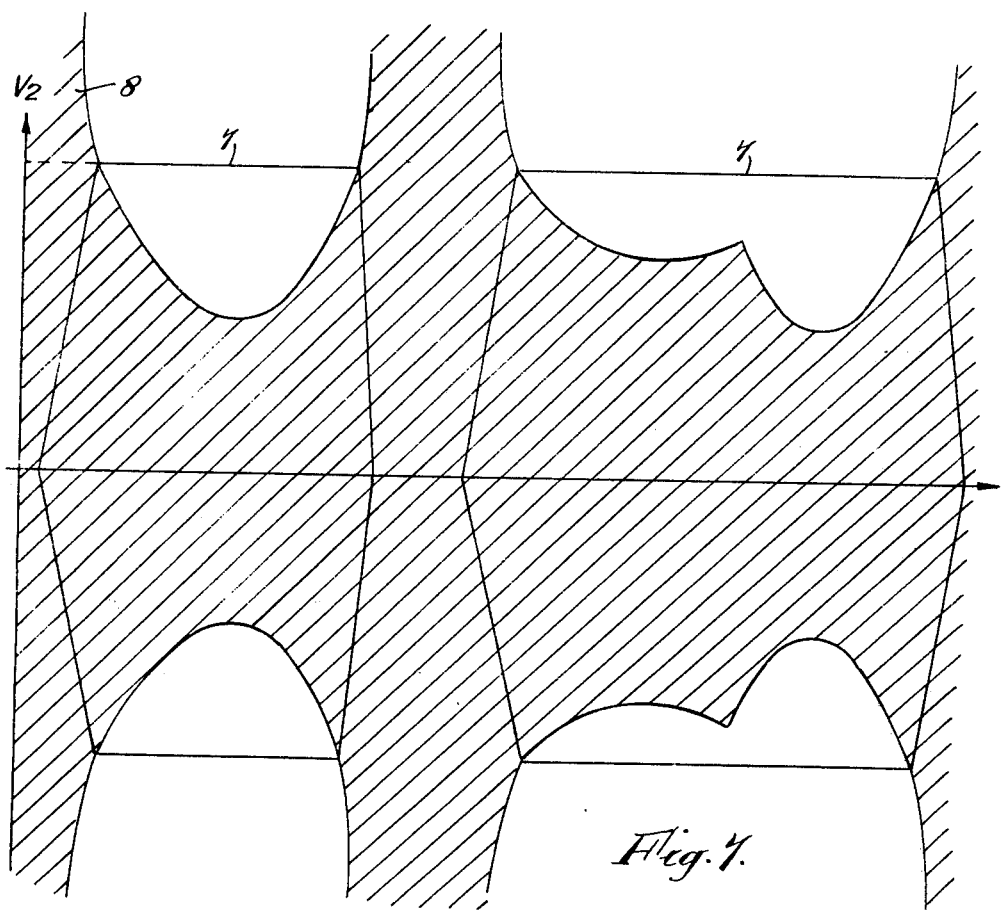
Figure 8:
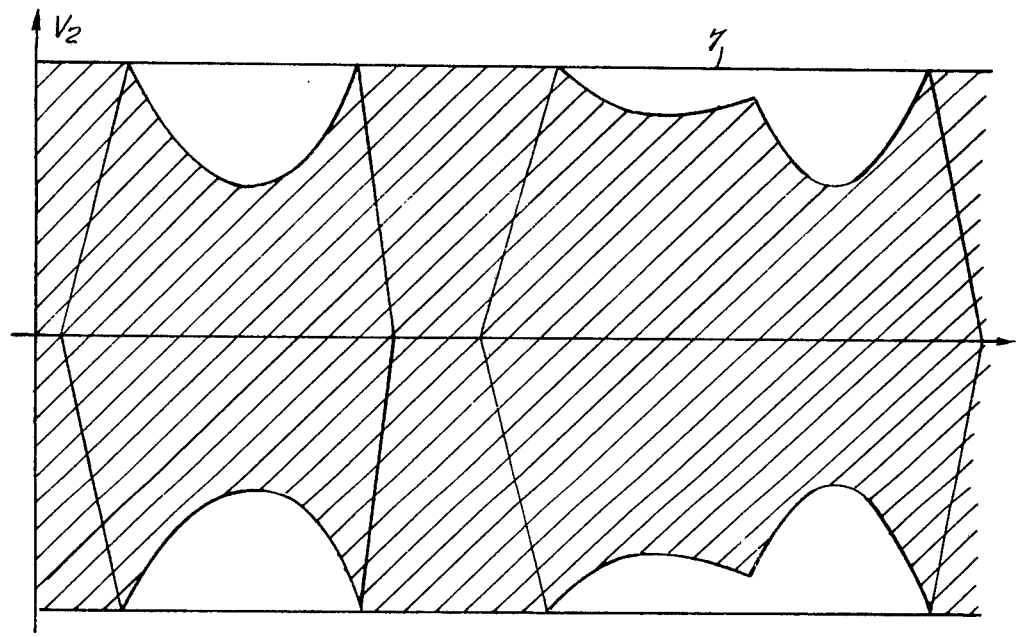

In the waveform shown in FIG. 6, the input signal $\theta_i$ to the compressor 1 consists of an interference signal 4 of any frequency or frequencies, but at a constant level, and two syllables of a wanted speech signal 5, of which a general envelope of many frequencies is shown, with a period of silence 6 between the two syllables. The level of the wanted speech signal 5 varies above and below the level of the interference signal 4, but the control signal input $V_c$ follows the former. Thus, the gain of the compressor is higher, the lower the level of wanted speech, and ideally the compressor 1 has a flat output 7 of wanted speech, as shown in FIG. 7. Because of the constantly-varying gain, the interference signal 8 at the output of the compressor 1 is no longer constant, but ideally the ratio of signal to interference is the same as at the input. The threshold of the limiter 2 is set at the value of the wanted speech signal 7. Where the interference signal 8 at the output of the compressor 1 is at a level above the wanted speech signal 7, the output of the limiter 2 is also at this value, as illustrated in FIG. 8.

Figure 9:
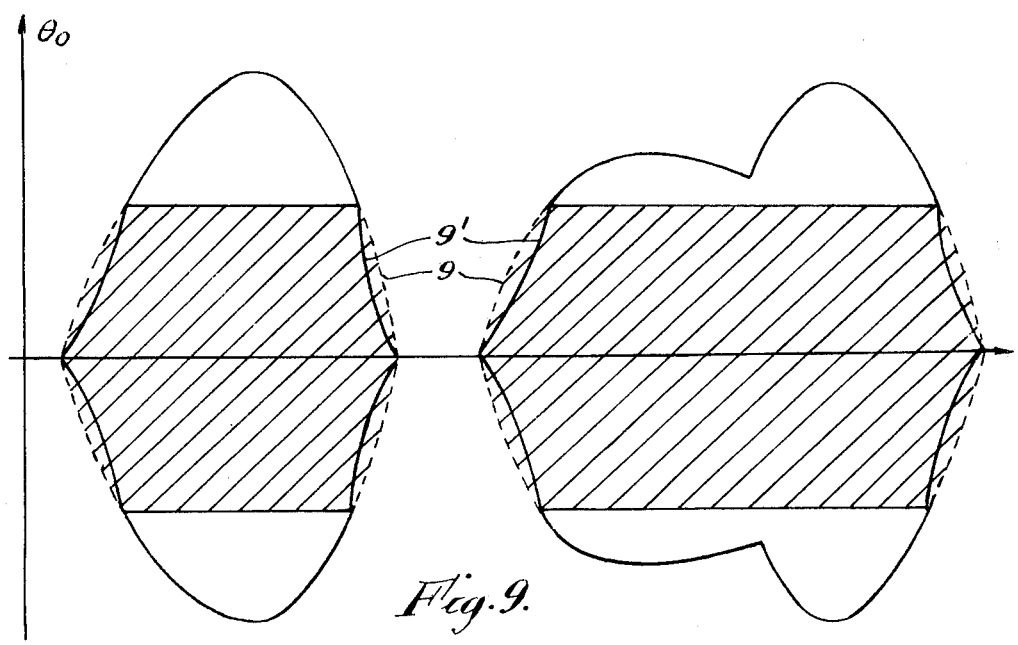

The input to the expander 3 is thus at a constant level, irrespective of the original relative values of wanted signal and interference. The gain of the expander 3, increases as $V_c$ increases, in a reciprocal manner to that of the compressor 1, and as a result the wanted speech signal 5 at the output $\theta_o$ of the expander is in its original form, as reproduced in FIG. 9. It will, however, be noted that while the interference follows the envelope of the original signal, as shown by the dotted line 9, the speech signal is slightly distorted at the beginning and end of each syllable, and follows the full line 9'.

The masking effect of the interference is greatly reduced, and the listener is hardly aware of the presence of the interfering signal. Its effect after passing through the compressor 1, the limiter 2 and the expander 3 is to introduce additional frequencies into the speech, and in most cases the number of such frequencies is small when compared with those naturally present.

Referring to FIG. 1B an input signal $\theta_i$ from an output of a radio receiver (not shown) and a control signal input $V_c$ enter a compressor 1'. The control signal input $V_c$ is a D.C. voltage whose value varies directly with the level of the wanted speech — i.e. at a syllabic rate — and is derived in a manner to be described later. The input signal $\theta_i$ consists of any interference present at the output of the receiver (not shown) and the wanted speech signal, which is a combination of alternating voltages of several hundred different frequencies, which for radio transmission purposes normally lie within the range of 300 - 3000 Hz. This second system is related to the first, and has the following differences:

a. The compressor control is derived from the compressor input, so that the compressor gain is a function of the composite input level signal plus interference).

b. The output of the compressor 1' is flat and the limiter 2 of the first embodiment is omitted.

The manner in which the control signal input $V_c$ is derived will now be described, with reference to FIG. 2. The input signal $\theta_i$ to the compressor 1 (FIG. 1A) is also fed to an automatic gain control amplifier 10, from which a constant level speech output is obtained, which is fed to a selectable filter 11 operable in the voice frequency band of 300 to 3000 Hz. Measured at the output of the receiver (not shown) interference exists as signals having discrete frequencies within the voice frequency band. Even interference sufficiently severe as to render a speech signal unreadable often consists of a relatively small number of such frequencies; it is very rare that it mutilates the entire voice frequency band. Furthermore, because of the way in which allotted channels are spaced, most interfering signals affect either end of the voice frequency band rather than the center. By means of the selectable filter a narrow slice of the voice frequency band, of approximately 200 Hz wide, is found which has the least interference. This slice is manually selected by the operator, who either listens to the noise at the output and selects the sample which gives the least level of interference, or he obtains the slice with the aid of a level measuring set. The mean amplitude of any such slice is not exactly equal to the mean amplitude of the whole band, but slices taken with center frequencies between 300 Hz and 1.3 KHz are sufficiently representative of this amplitude.

The output of the selectable filter 11 is connected to the input of an amplifier 12, whose output is connected to a speech amplitude assessor 13, which in turn has an output $V_c$ whose value varies directly with the level of the wanted speech, because of the slice having the least interference that has been found using the selectable filter 11.

The output of the amplifier 12 is also passed to an assessor 14 having a long time constant, and from there to the automatic gain control amplifier 10 in order to control the latter, so that it has the constant level output mentioned above.

The only type of interference normally encountered that has a wide band width characteristic is impulse noise, generated for example by machinery and certain types of lighting. This type of interference is detected by a noise detector 15 which is a third circuit having as an input the input signal $\theta_i$ and, by means of a monostable circuit 16, the amplifier 12 is muted for the duration of each pulse. Thus, impulse noise does not influence the level of the control signal and, because of the very short duration of each impulse compared with the time constant involved, has no significant influence on the level of the control signal $V_c$.

In order that the limiter 2 contributes no distortion, the circuit of FIG. 3 is employed. The voice frequency signals of frequency represented by $f_s$, modulate in a balanced modulator 17 signals from an oscillator 18 of frequency represented by $f_g$ and produce a double side-band suppressed carrier signal of frequency given by $f_g + f_s$ and $f_g - f_s$. A limiter 19, which is a normal limiter circuit for radio frequencies, limits this signal if its level lies above the threshold value $V_q$ volts. The limiting process introduces harmonic distortion products $3(f_g + f_s)$, $3(f_g - f_s)$, $5(f_g + f_s)$ etc., but $f_g$ is made to be much higher than $f_s$, and therefore none of the distortion products falls within the modulated double side-band. As a result, the lowest distortion product is easily attenuated by a filter 20, and the limited double side-band is then demodulated in a demodulator 21 by heterodyning with the signal of frequency $f_g$. A limited signal of frequency $f_s$ is thus recovered.

Referring now to FIG. 4, which shows the second preferred embodiment, those circuit blocks which are identical to or equivalent to the circuit blocks of the first embodiment have like reference numerals. The compressor 1 and limiter 2 of the first embodiment have been replaced by a single block 1' representing a compressor. It is known that if the limiter contributes no distortion, then the process of compression and limiting in the case where the compression is controlled by an interference free sample, achieves the same end results as infinitely compressing the signal in the case where the compression is controlled by the whole signal, i.e. both speech and interference. In the embodiment shown in FIG. 4 the compressor 1 is driven with and controlled by the speech plus interference, and is associated with an amplitude assessor (rectifier) 23, which takes the place of block 13 in order to control the compressor in the same manner as in the first embodiment. An example of the amplitude assessor (rectifier) is given in U.S. Pat. No. 3,206,556. The expander 3 is controlled by the filtered sample. This arrangement is slightly less complex and more stable.

The second difference over the first embodiment resides in the whole circuit being preceded by an A.G.C. system to make it independent of receiver output levels. This A.G.C. system includes an amplifier 24 and a feedback assessor 25, arranged to function in similar manner to the amplifier 10 and assessor 14.

For practical reasons the order of the blocks 10 and 11 have been reversed. The impulse noise detector 15 and mono-stable circuit 16 are associated with a gate element 35 which is in the form of an electronic switch, and which takes the place of the amplifier 12 in the previous embodiment. This gate element is likewise blocked for the duration of each pulse of noises, and thus the impulse muting circuit operates to mute the A.G.C. output rather than the filter output. The amplifier 10 now follows the filter 11 which receives the signals passed through the gate element 35.

Referring now to FIG. 5, the subjective quality of the speech in the presence of "white" noise is improved by the addition of a circuit in the system shown in FIG. 4, whereby the "white" noise is silenced between syllables. White noise is herein defined as being noise having no discrete frequency characteristic.

The circuit includes an amplifier 27; two parallel circuits fed from the output of the amplifier 27, and each having respective rectifiers 28 and 29 and respective time constant circuits 30 and 31; a comparator 32; a third time constant circuit 33; and two gates 26 and 34 ideally having variable attenuation between zero and infinity. The first gate 26 (shown dotted in FIG. 4) is inserted between the amplifier 10, and amplitude assessor 13, and is controlled by a signal WNc from the circuit of FIG. 5, whereby the amplitude assessor 13 receives no input between syllables, and hence expander 3 does not open between syllables. The second gate 34 is inserted between the rectifier 29 and the time constant circuit 31, and controlled from the output of the comparator 32.

The first time constant circuit 30 has a relatively short attack time constant, and thus faithfully follows the abrupt changes in amplitude levels of the speech signal. The second time constant circuit 31 has a relatively long attack time constant, and thus only rises very slowly at the beginning of a speech syllable. The output of the circuit 30 thus represents a summation of white noise plus speech signal, whereas the output of the circuit 31 represents only noise.

Under "no signal" conditions, the two inputs to the comparator 32 are equal and the comparator gives a "0" input. As soon as the first syllable of the speech signal arrives, the circuit 30 detects the signal below the level of the white noise, and provides a greatly increased voltage on the first input to the comparator 32, which immediately changes its state to give a "1" output. The comparator 32 stays in its 1 state until the speech syllable ceases, when it reverts to its 0 state again. The third time constant circuit 33 acts as a pulse shaper and slightly rounds off the sharp square wave output produced by the comparator 32. The gate 26 is thus held open for the duration of the speech signal, and blocked for the inter-syllable gaps so as to mute the white noise.

The second gate 34 is provided to block the input to the second time constant circuit 31 as soon as the comparator 32 produces a 1 output. This ensures that the second time constant circuit 31 is not affected by the speech signal.

The combination of the circuits of FIGS. 4 and 5 thus provides between syllable quietening by removal of the white noise. This permits a four wire radio circuit to be connected to a two-wire land-line circuit without the use of singing suppressors.

In the embodiment of FIG. 2, white noise can also be silenced between syllables by the addition of the gate 26 (shown dotted) between the amplifier 12 and the speech amplitude assessor 13, the control signal WNc being obtained from the circuit shown in FIG. 5.

What I claim and desire to secure by Letters Patent is:

1. A method of improving intelligibility of an audio frequency signal containing interference and wanted speech signals, including the steps of filtering the frequency band of the audio frequency signal so as to derive a narrow band section in which the interference is the least, filtering said narrow section from the remainer of the band, and generating a control signal from the derived section by using the changing value of the mean amplitude of the derived narrow section, and amplitude modulating the audio frequency signal on the basis of the control signal.

2. A method of improving intelligibility of an audio frequency signal containing interference and wanted speech signals, including the steps of filtering the frequency band of the audio frequency signal so as to derive a narrow band section in which the interference is the least, filtering said narrow section from the remainer of the band, and generating a control signal from the derived section by using the changing value of the amplitude of the derived narrow section, amplifying the audio frequency signal by a gain which decreases as the value of the derived control signal increases, limiting the level of the amplified signal at a given level, and amplifying the resulting limited signal by a gain which increases as the value of the derived control signal increases amplitude modulating the audio frequency signal on the basis of the control signal.

3. The method according to claim 1, including the additional step of detecting impulse noise, and muting the generation of the control signal for the duration of each pulse of said impulse noise.

4. The method according to claim 2, wherein the step of limiting the level of the interference includes the step of modulating the filtered and amplified audio signal with a fixed frequency to produce a double side-band suppressed carrier signal, limiting the thus generated signal if its level exceeds that of the already compressed speech and demodulating the double side-band signal by heterodyning it with the fixed frequency so as to recover the original audio signal in limited form.

5. Apparatus for improving intelligibility of an audio frequency signal containing interference and wanted speech signals, said apparatus comprising: a first filter for filtering out, from the remainder of the frequency band of the incoming signal, a narrow section in which the interference has been found to be the least; means for deriving a control signal whose value at any instant equals the amplitude of the filtered narrow section; a compressor comprising an amplifier whose gain decreases as the value of the derived control signal increases to compress the speech signals to a fixed level; a limiter receiving the output from the compressor for removing all interference whose amplitude exceeds the fixed level of the wanted signal after compression; and an expander receiving the output from the limiter and comprising an amplifier whose gain increases as the value of the derived control signal increases to thereby improve the intelligibility of the wanted speech signal, said control signal being supplied to said compressor and expander, said apparatus amplitude modulating the interference to follow the amplitude modulation of the original speech, the expander producing an output which is the processed audio frequency speech signal.

6. Apparatus according to claim 5, wherein the means for deriving the control signal includes an amplifier.

7. Apparatus according to claim 6, further comprising means for detecting impulse noise being connected to receive the narrow section of the frequency band, and means for muting said amplifier of said means for deriving a control signal for the duration of the impulse noise.

8. Apparatus according to claim 7, wherein said means for detecting impulse noise comprises an impulse noise detector and a monostable circuit operable to mute the amplifier of said means for deriving a control signal on receiving an output from the detector.

9. Apparatus according to claim 5, wherein the limiter includes an oscillator; a modulator receiving the wanted speech signals, and connected to the oscillator signals to produce a double side-band suppressed carrier signal; and a limiter circuit for limiting the double side-band suppressed carrier signal if the level rises above a given threshold value; a second filter connected to said limiter circuit for removing harmonics generated in the modulation process; and a demodulator connected to the second filter for demodulating the limited double side-band signal by heterodyning it with the output of the oscillator.

10. Apparatus according to claim 5, including an A.G.C. stage connected to the compressor and said first filter.

11. Apparatus according to claim 10, comprising impulse noise detecting means for detecting impulse noise from the output of the A.G.C. stage, and a gate element is provided between the A.G.C. stage and the first filter, said impulse noise detecting means blocking the gate for the duration of the impulse noise.

12. Apparatus according to claim 11, wherein said impulse noise detecting means comprises a detector and a monostable circuit.

13. Apparatus according to claim 5, including means for removing "white" noise from the output of the expander between syllables in a speech signal.

14. Apparatus according to claim 13, including means for detecting the speech signal below the level of the "white" noise from the output of the first filter; means for generating a signal for the duration of each syllable component of the speech signal; and gate means connected between said first filter and said expander, the signal being applied to said gate to keep the expander open only during the syllables of speech whereby the "white" noise is muted between syllables.

15. Apparatus according to claim 14, comprising a comparator; and a pair of parallel circuits (constituting the means for detecting the speech signals) supplying the inputs of said comparator, the first circuit of said parallel circuits including a first rectifier and a first time constant circuit having a time constant, so as to enable the speech syllable to be followed, and produce an output representative of white noise plus speech signal, the second circuit of said parallel circuits including a second rectifier and a second time constant circuit having a time constant longer than the first time constant, so that said second circuit barely responds to the speech signal, and therefore produces an output which is representative only of the consant level of white noise.

16. Apparatus for improving intelligibility of an audio frequency signal containing interference and wanted speech signals, said apparatus comprising: a first filter for filtering out, from the remainder of the frequency band of the incoming signal, a narrow section in which the interference has been found to be the least; means for deriving a control signal whose value at any instant equals the amplitude of the filtered narrow section; a compressor comprising an amplifier controlled from its own input and whose gain decreases as the level of its input increases to compress the speech signals to a fixed level whereby its output is flat and an expander comprising an amplifier whose gain increases as the value of the derived control signal increases to thereby improve the intelligibility of the wanted speech signal, said compressor being connected to said expander, said control signal being applied to said expander, said apparatus amplitude modulating the interference to follow the amplitude modulation of the original speech, the expander producing an output which is the processed audio frequency speech signal.

17. Apparatus according to claim 16, wherein the means for deriving the control signal includes an amplifier.

18. Apparatus according to claim 17, further comprising means for detecting impulse noise being connected to receive the narrow section of the frequency band, and means for muting said amplifier of said means for deriving a control signal for the duration of the impulse noise.

19. Apparatus according to claim 18, wherein said means for detecting impulse noise comprises an impulse noise detector and a monostable circuit operable to mute the amplifier of said means for deriving a control signal on receiving an output from the detector.

20. Apparatus according to claim 16, including an A.G.C. stage connected to the compressor and said first filter.

21. Apparatus according to claim 20, comprising impulse noise detecting means for detecting impulse noise from the output of the A.G.C. stage, and a gate element is provided between the A.G.C. stage and the first filter, said impulse noise detecting means blocking the gate for the duration of the impulse noise.

22. Apparatus according to claim 21, wherein said impulse noise detecting means comprises a detector and a monostable circuit.

23. Apparatus according to claim 16, including means for removing "white" noise (as herein defined) from the output of the expander between syllables in a speech signal.

24. Apparatus according to claim 23, including means for detecting the speech signal below the level of the "white" noise from the output of the first filter; means for generating a signal for the duration of each syllable component of the speech signal; and gate means connected between said first filter and said expander, the signal being applied to said gate to keep the expander open only during the syllables of speech whereby the "white" noise is muted between syllables.

25. Apparatus according to claim 24, comprising a comparator; and a pair of parallel circuits (constituting the means for detecting the speech signals) supplying the inputs of said comparator, the first circuit of said parallel circuits including a first rectifier and a first time constant circuit having a time constant, so as to enable the speech syllable to be followed, and produce an output representative of white noise plus speech signal, the second circuit of said parallel circuits including a second rectifier and a second time constant circuit having a time constant longer than the first time constant, so that said second circuit barely responds to the speech signal, and therefore produces an output which is representative only of the contant level of white noise.

* * * * *